(12) United States Patent  
Chang et al.

(10) Patent No.: US 9,287,501 B1
(45) Date of Patent: Mar. 15, 2016

(54) RESISTIVE RANDOM ACCESS MEMORY AND METHOD FOR PRODUCING SAME

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Chih-Hung Pan, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/573,905

(22) Filed: Dec. 17, 2014

(30) Foreign Application Priority Data

Dec. 2, 2014 (TW) .............................. 103141846 A

(51) Int. Cl.
*H01L 29/10* (2006.01)
*H01L 45/00* (2006.01)

(52) U.S. Cl.
CPC .......... *H01L 45/146* (2013.01); *H01L 45/1233* (2013.01); *H01L 45/1253* (2013.01); *H01L 45/16* (2013.01)

(58) Field of Classification Search
CPC ..... H01L 45/08; H01L 45/085; H01L 45/145; H01L 45/146; H01L 45/147; H01L 45/1625; H01L 45/1233; G11C 11/5685

USPC ............................................ 257/43, E45.003
See application file for complete search history.

(56) References Cited

U.S. PATENT DOCUMENTS

| | | | |
|---|---|---|---|
| 8,320,161 B2 * | 11/2012 | Schloss et al. | ................. 365/148 |
| 8,587,983 B2 | 11/2013 | Ho et al. | |
| 8,592,794 B2 | 11/2013 | Chang et al. | |
| 2007/0215977 A1 | 9/2007 | Lee et al. | |

* cited by examiner

*Primary Examiner* — Tu-Tu Ho
(74) *Attorney, Agent, or Firm* — Muncy, Geissler, Olds & Lowe, P.C.

(57) ABSTRACT

A resistive random access memory includes an oxygen-poor layer disposed on a first electrode layer and formed by indium tin oxide, indium oxide, tin dioxide, or zinc oxide. An insulating layer is disposed on the oxygen-poor layer and is formed by silicon dioxide or hafnium oxide. A second electrode layer is disposed on the insulating layer. A method for producing a resistive random access memory includes preparing a first electrode layer. An oxygen-poor layer is then formed on the first electrode layer. The oxygen-poor layer is formed by indium tin oxide, indium oxide, tin dioxide, or zinc oxide. Next, an insulating layer is formed on the oxygen-poor layer. The insulating layer formed by silicon dioxide or hafnium oxide. A second electrode layer is then formed on the insulating layer.

4 Claims, 5 Drawing Sheets

RESISTIVE RANDOM ACCESS MEMORY AND METHOD FOR PRODUCING SAME

BACKGROUND OF THE INVENTION

1. Field of the Invention

The present invention relates to a resistive random access memory and a method for producing the resistive random access memory and, more particularly, to a resistive random access memory with an oxygen concentration difference and a method for producing the resistive random access memory.

2. Description of the Related Art

Memories have been widely used in various electronic products. Due to the increasing need of data storage, the demands of the capacities and performances of the memories become higher and higher. Among various memory elements, resistive random access memories (RRAMs) have an extremely low operating voltage, an extremely high read/write speed, and highly miniaturization of the element size and, thus, may replace the conventional flash memories and dynamic random access memories (DRAMs) as the main stream of memory elements of the next generation.

FIG. 1 is a diagrammatic view of a structure of a conventional resistive random access memory 9. The conventional resistive random access memory 9 includes two electrode layers 91 and a resistive switching layer 92. The resistive switching layer 92 is located between the two electrode layers 91 to form a metal/insulator/metal (MIM) structure. The oxidation/reduction reaction of the metal filaments M in the resistive switching layer 92 can switch the resistive switching layer 92 between a low resistance state (LRS) and a high resistance state (HRS) for storing two logic states (such as 0 or 1).

When the two electrode layers 91 are supplied with electricity, although the resistive switching layer 92 possesses the resistive switching characteristics, the electric field is not uniformly distributed among the dielectrics such that the conductive path formed by the resistive switching layer 92 is unstable, leading to unstable characteristics of the resistive random access memory element while failing to reduce the power consumption.

Thus, improvement to the conventional technique is required for enhancing the utility.

SUMMARY OF THE INVENTION

An objective of the present invention is to provide a resistive random access memory capable of forming an oxygen concentration gradient in the material layer between two electrode layers.

Another objective of the present invention is to provide a method for producing a resistive random access memory capable of forming an oxygen concentration gradient in the material layer between two electrode layers.

The present invention fulfills the above objectives by providing a resistive random access memory including a first electrode layer. An oxygen-poor layer is disposed on the first electrode layer and is formed by indium tin oxide, indium oxide, tin dioxide, or zinc oxide. An insulating layer is disposed on the oxygen-poor layer and is formed by silicon dioxide or hafnium oxide. A second electrode layer is disposed on the insulating layer.

The first electrode layer can be formed by titanium nitride or platinum.

The second electrode layer can be formed by indium tin oxide or platinum.

In another aspect, the present invention provides a method for producing a resistive random access memory. The method includes preparing a first electrode; forming an oxygen-poor layer on the first electrode layer, with the oxygen-poor layer formed by indium tin oxide, indium oxide, tin dioxide, or zinc oxide; forming an insulating layer on the oxygen-poor layer, with the insulating layer formed by silicon dioxide or hafnium oxide; and forming a second electrode layer on the insulating layer.

The first electrode layer can be formed by titanium nitride or platinum.

The second electrode layer can be formed by indium tin oxide or platinum.

In the resistive random access memory and its producing method, the insulating layer and the oxygen-poor layer together form a resistive switching layer. The oxygen ion concentration in the insulating layer is high, and the oxygen ion concentration in the oxygen-poor layer is low, such that an oxygen ion concentration gradient exists between the insulating layer and the oxygen-poor layer. The oxygen ion concentration gradient and the external electric field together provide the driving force for moving the oxygen ions to greatly reduce the working voltage of the resistive random access memory during setting and resetting and to greatly reduce the current at the same reading voltage. The effects of good operating stability, reducing the operating voltage and reducing power consumption can be achieved, improving the disadvantages of unstable element characteristics and difficulties in reducing power consumption encountered in the conventional resistive random access memory.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

DETAILED DESCRIPTION OF THE INVENTION

Figure 1:
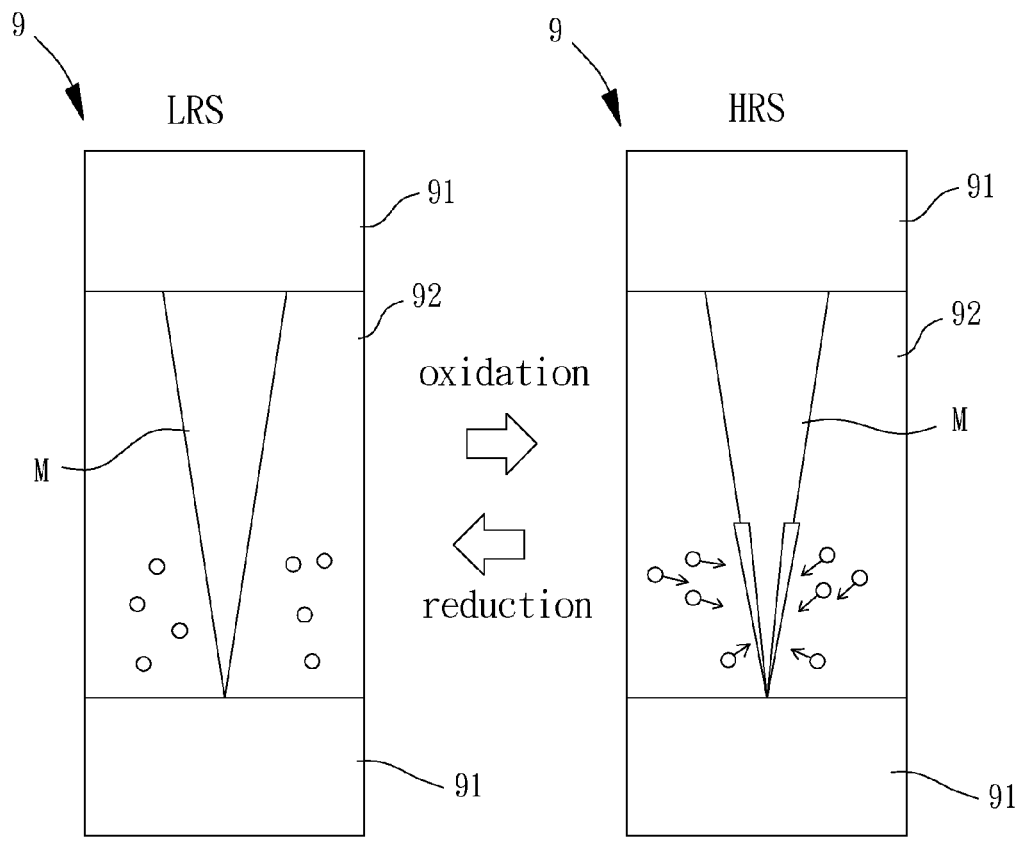
FIG. 1 is a diagrammatic view illustrating operation of a conventional resistive random access memory.
Figure 2:
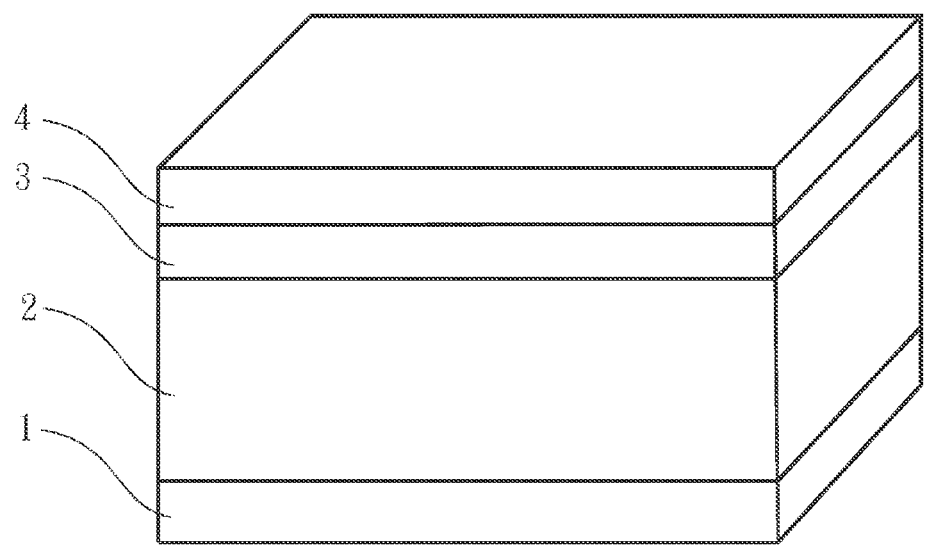
FIG. 2 is a perspective view of a resistive random access memory of an embodiment according to the present invention.

FIG. 2 is a perspective view of a resistive random access memory of an embodiment according to the present invention. The resistive random access memory includes a first electrode layer 1, an oxygen-poor layer 2, an insulating layer 3, and a second electrode layer 4. The oxygen-poor layer 2 is disposed on the first electrode layer 1. The insulating layer 3 is disposed on the oxygen-poor layer 2. The second electrode layer 4 is disposed on the insulating layer 3.

The first electrode layer 1 can be formed by an electrically conductive material, such as titanium nitride (TiN) or platinum (Pt). The second electrode layer 4 can also be formed by an electrically conductive material, such as indium tin oxide (ITO) or platinum (Pt). The second electrode layer 4 and the first electrode layer 1 can be used to apply a working voltage to the resistive random access memory. The oxygen-poor layer 2 is formed by an oxygen-poor material, such as indium tin oxide (ITO), indium oxide ($In_2O_3$), tin dioxide ($SnO_2$), or zinc oxide (ZnO). The insulating layer 3 can be formed by an insulating material, such as silicon dioxide ($SiO_2$) or hafnium oxide (HfO). However, the present invention is not limited to these examples. An embodiment including the first electrode layer 1 formed by titanium nitride, the oxygen-poor layer 2 formed by indium tin oxide, the insulating layer 3 formed by silicon dioxide, and the second electrode layer 4 formed by indium tin oxide will be set forth hereinafter. The thicknesses of the oxygen-poor layer 2 and the insulating layer 3 are 1-20 nm. However, the present invention is not limited to this embodiment.

Still referring to FIG. 2, in use of the resistive random access memory of the embodiment according to the present invention, an external electric field is applied to the first electrode layer 1 and the second electrode layer 4 to drive the oxygen ions for switching the resistance between the first electrode layer 1 and the second electrode layer 4, thereby switching between a high resistance state (HRS) and a low resistance state (LRS). The insulating layer 3 and the oxygen-poor layer 2 together form a resistive switching layer. The oxygen ion concentration in the insulating layer 3 is high, and the oxygen ion concentration in the oxygen-poor layer 2 is low, such that an oxygen ion concentration gradient exists between the insulating layer 3 and the oxygen-poor layer 2. After soft breakdown of the resistive random access memory, if the oxygen ion concentration gradient is increased (such as by using oxygen-rich silicon dioxide as the insulating layer 3 to generate an extremely high oxygen ion concentration gradient), the operating voltage of the resistive random access memory can greatly be reduced, which is advantageous to manufacture of resistive random access memories with extremely low power consumption.

Figure 3:
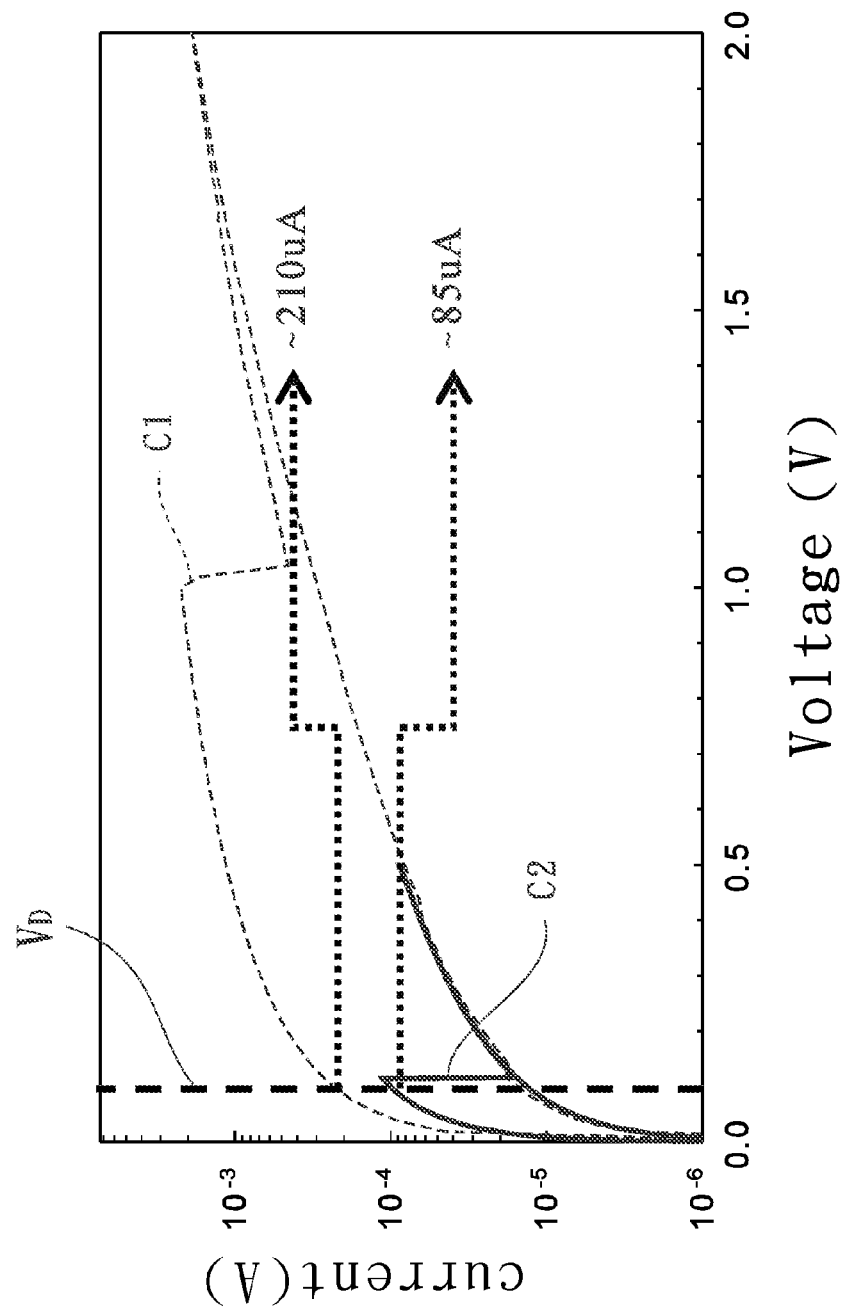
FIG. 3 is a diagram of current-voltage curves of the resistive random access memory of the embodiment according to the present invention and the conventional resistive random access memory.

FIG. 3 is a diagram of current-voltage curves of the resistive random access memory of the embodiment according to the present invention and the conventional resistive random access memory, wherein curve C1 is the current-voltage curve of the conventional resistive random access memory of an MIM structure (ITO/Gd:$SiO_2$/TiN), and wherein curve C2 is the current-voltage curve of the resistive random access memory of the embodiment according to the present invention (the second electrode layer/insulating layer/oxygen-poor layer/first electrode layer is ITO/$SiO_2$/ITO/TiN). As can be seen from the curves C1 and C2, given the same reading voltage $V_D$ (the vertical phantom line), the current of curve C2 is obviously smaller than the current of curve C1. Namely, the resistive random access memory of the embodiment according to the present invention can reduce the reading voltage and the power consumption. Furthermore, the resistive random access memory of the embodiment according to the present invention possesses bipolar characteristics and provides operational stability in comparison with the conventional resistive random access memory with unipolar characteristics.

Figure 4:
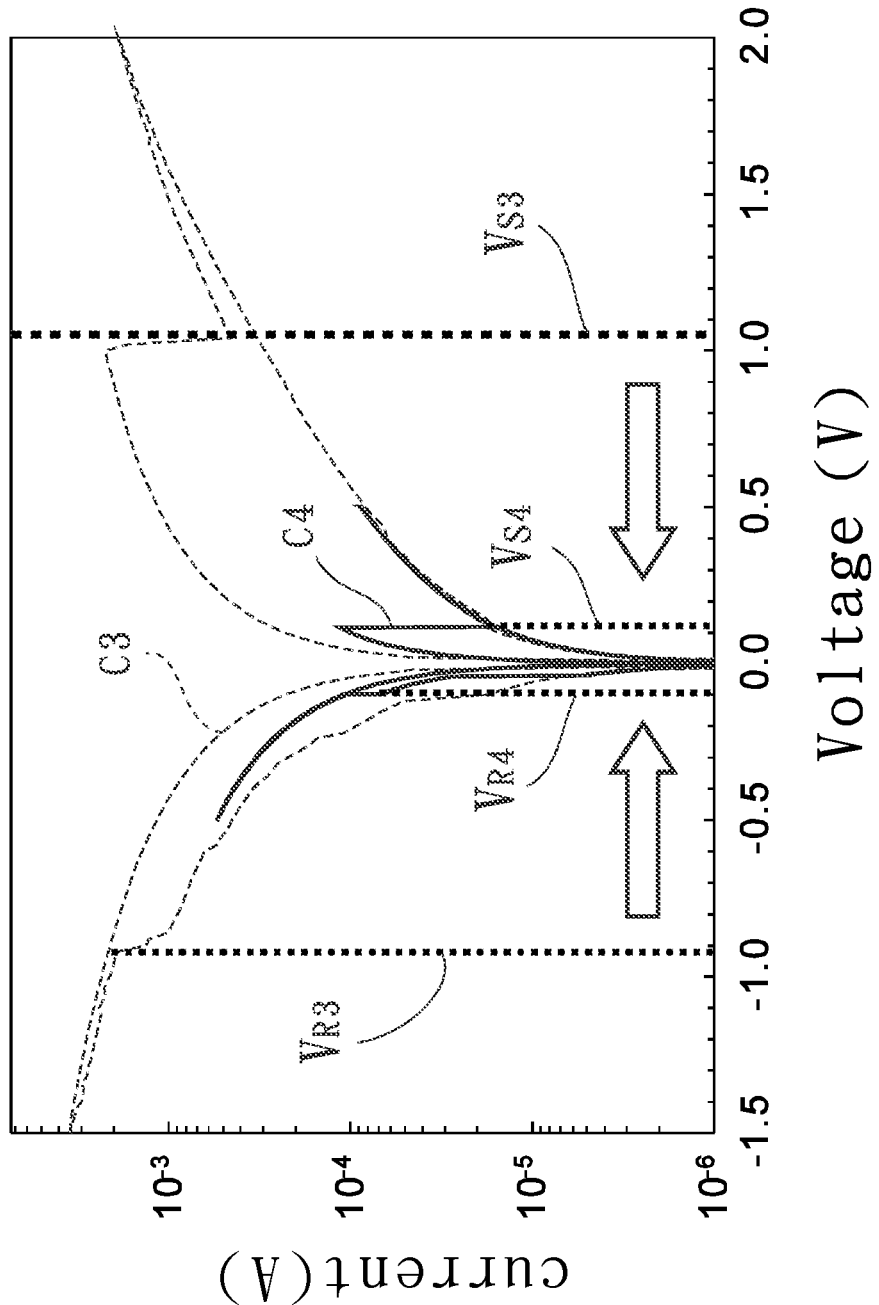
FIG. 4 is another diagram of current-voltage curves of the resistive random access memory of the embodiment according to the present invention and the conventional resistive random access memory.

FIG. 4 is another diagram of current-voltage curves of the resistive random access memory of the embodiment according to the present invention and the conventional resistive random access memory, wherein curve C3 is the current-voltage curve of the conventional resistive random access memory of an MIM structure (ITO/Gd:$SiO_2$/TiN), and wherein curve C4 is the current-voltage curve of the resistive random access memory of the embodiment according to the present invention (the second electrode layer/insulating layer/oxygen-poor layer/first electrode layer is ITO/$SiO_2$/ITO/TiN). As can be seen from the curves C3 and C4, the setting voltage $V_{S4}$ of the curve C4 is obviously smaller than the setting voltage $V_{S3}$ of the curve C3 by about 90%, and the resetting voltage $V_{R4}$ of the curve C4 is obviously smaller than the resetting voltage $V_{R3}$ of the curve C3 by about 90%. Thus, in the resistive random access memory of the embodiment according to the present invention, since the oxygen ion concentration gradient can provide the driving force required for diffusion of oxygen ions, the working voltage of the resistive random access memory during setting and resetting can greatly be reduced. Thus, the resistive random access memory of the embodiment according to the present invention consumes extremely small power during working and, thus, can be mounted in electronic products (such as portable devices) with low power consumption.

Figure 5:
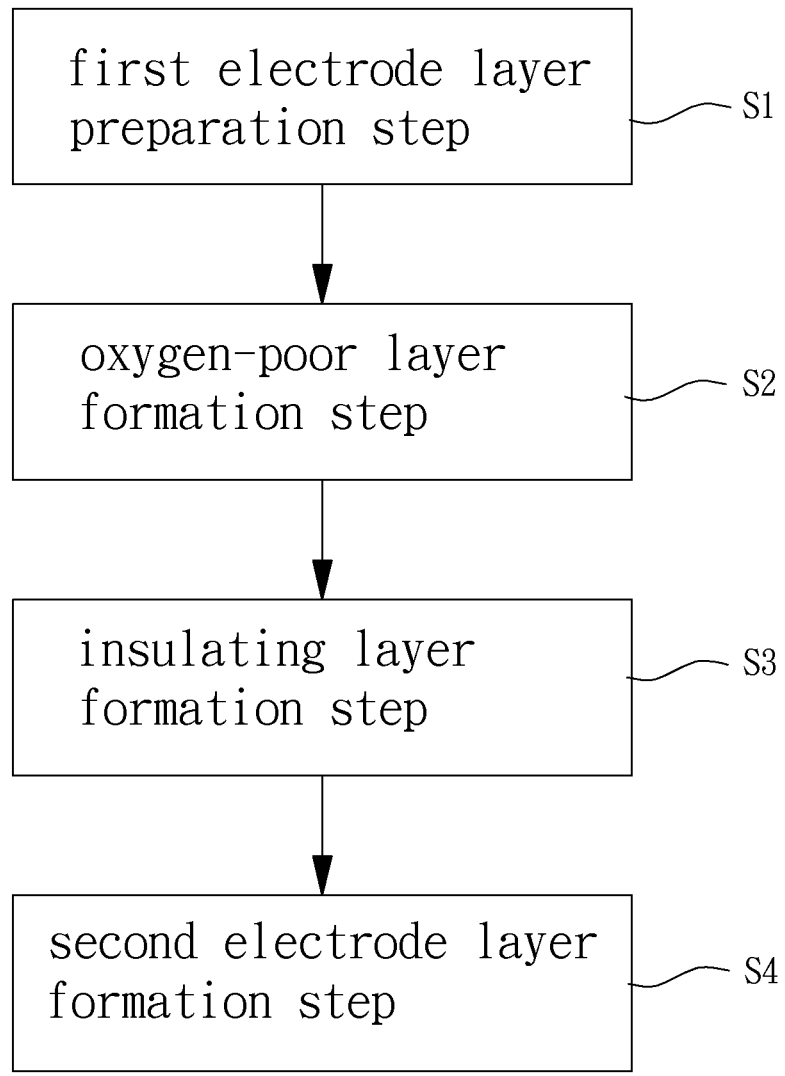
FIG. 5 is a block diagram illustrating a method for producing a resistive random access memory according to the present invention.

FIG. 5 is a block diagram illustrating a method for producing a resistive random access memory according to the present invention. The method includes a first electrode layer preparation step S1, an oxygen-poor layer formation step S2, an insulating layer formation step S3, and a second electrode layer formation step S4.

With reference to FIG. 2, a first electrode layer 1 is prepared in the first electrode layer preparation step S1. In this embodiment, an electrically conductive material, such as titanium nitride or platinum, can be sputtered on a substrate (not shown) to form the first electrode layer 1, such as by physical sputtering. The sputtering time can be adjusted according to the thickness of the first electrode layer 1. The equipment and setting required for sputtering can be appreciated by one having ordinary skill in the art. Furthermore, the first electrode layer 1 can be a conductive film that has been produced, such as a film of titanium nitride, platinum, or any other conductive material. The present invention is not limited to these examples.

In the oxygen-poor layer formation step S2 the oxygen-poor layer 2 is formed on the first electrode layer 1. In this embodiment, an oxygen-poor material, such as indium tin oxide, indium oxide, tin dioxide, or zinc oxide, is sputtered on the first electrode layer 1 to form the oxygen-poor layer 2. The concentration ratio of the oxygen-poor material and the sputtering time can be adjusted according to actual needs, which can be appreciated by one having ordinary skill in the art.

In the insulating layer formation step S3 the insulating layer 3 is formed on the oxygen-poor layer 2. In this embodiment, an insulating material, such as silicon dioxide or hafnium oxide, is sputtered on the oxygen-poor layer 2 to form the insulating layer 3. The concentration ratio of the insulating material and the sputtering time can be adjusted according to actual needs, which can be appreciated by one having ordinary skill in the art.

In the second electrode layer formation step S4 the second electrode layer 4 is formed on the insulating layer 3. In this embodiment, an electrically conductive material, such as indium tin oxide or platinum, can be sputtered on the insulating layer 3 to form the second electrode layer 4. The sputtering time can be adjusted according to the thickness of the second electrode layer 4. The equipment and setting required for sputtering can be appreciated by one having ordinary skill in the art.

In view of the foregoing, the main features of the resistive random access memory and its producing method of the embodiment according to the present invention are that the resistive random access memory includes a first electrode layer 1, an oxygen-poor layer 2, an insulating layer 3, and a second electrode layer 4. The oxygen-poor layer 2 is formed by an oxygen-poor material, such as indium tin oxide, indium oxide, tin dioxide, or zinc oxide. The insulating layer 3 is formed by an insulating material, such as silicon dioxide or hafnium oxide. These insulating materials are easy to obtain and are compatible with existing semiconductor manufacturing procedures, achieving the effects of easy transfer of technique and mass production.

Furthermore, the insulating layer 3 and the oxygen-poor layer 2 of the resistive random access memory of the embodiment according to the present invention can together form a resistive switching layer. The oxygen ion concentration in the insulating layer 3 is high, and the oxygen ion concentration in the oxygen-poor layer 2 is low, such that an oxygen ion concentration gradient exists between the insulating layer 3 and the oxygen-poor layer 2. The oxygen ion concentration gradient and the external electric field together provide the driving force for moving the oxygen ions to greatly reduce the working voltage of the resistive random access memory during setting and resetting and to greatly reduce the current at the same reading voltage. The effects of reducing the operating voltage and reducing power consumption can be achieved, improving the disadvantages of unstable element characteristics and difficulties in reducing power consumption encountered in the conventional resistive random access memory.

Furthermore, the conventional resistive random access memory only possesses unipolar characteristics, whereas the resistive random access memory of the embodiment according to the present invention possesses bipolar characteristics, providing operational stability.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A resistive random access memory comprising:
   a first electrode layer;
   an oxygen-poor layer disposed on the first electrode layer, with the oxygen-poor layer formed by indium tin oxide, indium oxide, tin dioxide, or zinc oxide;
   an insulating layer disposed on the oxygen-poor layer, with the insulating layer formed by silicon dioxide or hafnium oxide; and
   a second electrode layer disposed on the insulating layer, wherein the second electrode layer is formed by indium tin oxide.

2. The resistive random access memory as claimed in claim 1, wherein the first electrode layer is formed by titanium nitride or platinum.

3. A method for producing a resistive random access memory, comprising:
   preparing a first electrode;
   forming an oxygen-poor layer on the first electrode layer, with the oxygen-poor layer formed by indium tin oxide, indium oxide, tin dioxide, or zinc oxide;
   forming an insulating layer on the oxygen-poor layer, with the insulating layer formed by silicon dioxide or hafnium oxide; and
   forming a second electrode layer by indium tin oxide on the insulating layer.

4. The method for producing a resistive random access memory as claimed in claim 3, wherein the first electrode layer is formed by titanium nitride or platinum.

* * * * *